(12) United States Patent
Chen

(10) Patent No.: US 11,520,101 B2
(45) Date of Patent: Dec. 6, 2022

(54) LUMINOUS KEYBOARD AND OPTICAL MODULE THEREOF

(71) Applicant: Darfon Electronics Corp., Taoyuan (TW)

(72) Inventor: Chao-Yu Chen, Taoyuan (TW)

(73) Assignee: DARFON ELECTRONICS CORP., Taoyuan (TW)

( * ) Notice: Subject to any disclaimer, the term of this patent is extended or adjusted under 35 U.S.C. 154(b) by 0 days.

(21) Appl. No.: 17/585,714

(22) Filed: Jan. 27, 2022

(65) Prior Publication Data
US 2022/0244445 A1 Aug. 4, 2022

(30) Foreign Application Priority Data

Jan. 29, 2021 (TW) ................. 110103600
Jan. 29, 2021 (TW) ................. 110103601

(51) Int. Cl.
*H01H 13/83* (2006.01)
*F21V 8/00* (2006.01)
(Continued)

(52) U.S. Cl.
CPC .......... *G02B 6/006* (2013.01); *G02B 6/0035* (2013.01); *G02B 6/0055* (2013.01); *G06F 3/021* (2013.01); *H01H 13/705* (2013.01); *H01H 13/83* (2013.01); *H01H 2219/06* (2013.01); *H01H 2219/062* (2013.01)

(58) Field of Classification Search
CPC .... H03K 17/969; H05B 47/155; H05B 47/10; H05B 47/18; H05B 45/20; G06F 3/04886; G06F 3/021; H04N 5/222; G01D 5/02; H01H 19/14; H01H 2019/143; H01H 13/705; G02B 6/0038; G02B 6/002;
(Continued)

(56) References Cited

U.S. PATENT DOCUMENTS 8,714,850 B2 5/2014 Ho et al.
9,983,346 B2 5/2018 Chen
(Continued)

FOREIGN PATENT DOCUMENTS

CN 103218051 A 7/2013
CN 206931518 U 1/2018
(Continued)

*Primary Examiner* — Fatima N Farokhrooz
(74) *Attorney, Agent, or Firm* — McClure, Qualey & Rodack, LLP

(57) ABSTRACT

A luminous keyboard and an optical module thereof are provided. The optical module includes a light guide sheet, a reflective film on one side of the light guide sheet, and an optical film on another side of the light guide sheet opposite to the reflective film. The optical film has a mask pattern. The mask pattern defines a light-transparent region, a light-shielding region, and a light modulation region extending from the light-shielding region to the light-transparent region. The light-transparent region allows light to pass therethrough. The light-shielding region blocks light. The light modulation region partially allows light to pass therethrough and partially blocks light, so that an average light-transmitting rate per unit area of the light modulation region is smaller than that of the light-transparent region and larger than that of the light-shielding region.

20 Claims, 8 Drawing Sheets

(51) Int. Cl.
*H01H 13/705* (2006.01)
*G06F 3/02* (2006.01)

(58) Field of Classification Search
CPC .... G02B 6/006; G02B 6/0035; G02B 6/0055; G05G 1/025; Y02B 20/40
See application file for complete search history.

(56) References Cited

U.S. PATENT DOCUMENTS

| | | | |
|---|---|---|---|
| 10,593,492 B1 | 3/2020 | Ho et al. | |
| 11,144,131 B1* | 10/2021 | Ho | G06F 3/0202 |
| 2016/0342222 A1 | 11/2016 | Hsu et al. | |
| 2018/0149797 A1* | 5/2018 | Chen | G06F 3/0202 |
| 2020/0401235 A1 | 12/2020 | Liang | |
| 2021/0082642 A1* | 3/2021 | Ho | H01H 13/705 |
| 2022/0084761 A1* | 3/2022 | Ho | H01H 13/83 |

FOREIGN PATENT DOCUMENTS

| | | |
|---|---|---|
| CN | 206931520 U | 1/2018 |
| CN | 108511240 B | 10/2019 |
| CN | 111489906 A | 8/2020 |
| CN | 211604989 U | 9/2020 |
| CN | 211788758 U | 10/2020 |
| TW | 201606830 A | 2/2016 |
| TW | M527120 U | 8/2016 |
| TW | 201701317 A | 1/2017 |
| TW | I592970 B | 7/2017 |
| TW | I668392 B | 8/2019 |
| TW | 202029247 A | 8/2020 |
| TW | M603188 U | 10/2020 |

\* cited by examiner

LUMINOUS KEYBOARD AND OPTICAL MODULE THEREOF

BACKGROUND OF THE INVENTION

1. Field of the Invention

The invention generally relates to a luminous keyboard and an optical module thereof. Particularly, the invention relates to a luminous keyboard and an optical module thereof, which modulates the brightness of keyswitches.

2. Description of the Prior Art

Keyboards are very important input devices for electronic products, especially computers. As the electronic products become miniature and light-weighted, the slim border design is one of the important research and development directions of keyboards today. However, for luminous keyboards, the integration of the keyswitch module and the backlight module must be considered, especially the adhesion between the multiple optical films of the backlight module and the avoidance of lateral light leakage, so that the lighting uniformity between the outer keyswitch and the inner keyswitch is not easy to control. In particular, in the slim border design, as the margin of the border is reduced, the luminous keyboard generally encounters the problem of too bright or too dark at the outer keyswitches.

Moreover, for the purpose of heat dissipation or positioning, the backlight module generally has a plurality of holes or openings to allow air or positioning means (e.g. bolts or screws) to pass therethrough, so that the keyswitches around the holes will become darker or brighter than other keyswitches. In addition, the keyswitches neighboring the light source of the backlight module will also become too bright or too dark in comparison with other keyswitches.

SUMMARY OF THE INVENTION

It is an object of the invention to provide a luminous keyboard and an optical module thereof, which can modulate the brightness of a desired keyswitch, such as outer keyswitch, keyswitch adjacent to the through hole and/or the light source, to improve the lighting uniformity.

In an embodiment, the invention provides an optical module for a luminous keyboard. The optical module includes a light guide sheet, a reflective film on one side of the light guide sheet, and an optical film on another side of the light guide sheet opposite to the reflective film. The optical film has a mask pattern. The mask pattern defines a light-transparent region, a light-shielding region, and a light modulation region extending from the light-shielding region to the light-transparent region. The light-transparent region allows light to pass therethrough. The light-shielding region blocks light. The light modulation region partially allows light to pass therethrough and partially blocks light, so that the light modulation region has an average amount of light-transmitted per unit area smaller than that of the light-transparent region and larger than that of the light-shielding region.

In an embodiment, the light modulation region includes a plurality of light-transparent sub-regions and a plurality of light-shielding sub-regions, and the plurality of light-transparent sub-regions and the plurality of light-shielding sub-regions are alternatingly disposed.

In an embodiment, each of the plurality of light-shielding sub-regions has a first end and a second end opposite to the first end. The first end is connected to the light-shielding region, and the second end extends to the light-transparent region.

In an embodiment, the first end has a width larger than or equal to a width of the second end. When the width of the first end is larger than that of the second end, the width of the light-shielding sub-region is gradually reduced from the light-shielding region to the light-transparent region.

In an embodiment, the light modulation region surrounds the light-shielding region. The width of the first end is smaller than the width of the second end. The width of the light-shielding sub-region is gradually increased from the light-shielding region to the light-transparent region.

In an embodiment, the light-shielding region partially surrounds the light-transparent region to form a boundary line, and two ends of the boundary line are substantially connected to middle sections of two opposite sides of the light modulation region.

In an embodiment, the average amount of light-transmitted per unit area of the light modulation region substantially maintains constant or is increased from the light-shielding region to the light-transparent region.

In an embodiment, the light guide sheet has an edge. When the optical film, the light guide sheet, and the reflective film are stacked on one another, a vertical projection of the edge of the light guide sheet on the optical film partially falls within the light modulation region or within the light-shielding region adjacent to the light modulation region.

In an embodiment, the plurality of light-shielding sub-regions and the plurality of light-transparent sub-regions are alternatingly disposed along the edge of the light guide sheet.

In an embodiment, the light guide sheet has a hole. When the optical film, the light guide sheet, and the reflective film are stacked on one another, a vertical projection of an edge of the hole of the light guide sheet on the optical film at least partially falls within the light modulation region. The plurality of light-shielding sub-regions and the plurality of light-transparent sub-regions are alternatingly disposed along the edge of the hole of the light guide sheet.

In an embodiment, the optical module further includes a light source having a light-emitting surface. The light guide sheet guides light emitted from the light source. The vertical projection of the light source on the optical film falls within the light-shielding region. The light modulation region extends from the light-shielding region to the light-transparent region and is located between the light-transparent region and the light-emitting surface.

In another embodiment, the invention provides a luminous keyboard including the optical film described above and at least one keyswitch disposed over the optical module. In an embodiment, the keyswitch includes a keycap, and a vertical projection of the keycap on the optical film at least partially covers the light-transparent region.

In an embodiment, the keycap has a light-transparent portion. The plurality of light-shielding sub-regions and the plurality of light-transparent sub-regions are alternatingly arranged along an extending direction of the light-transparent portion.

Compared with the prior art, the luminous keyboard and the optical module of the invention can effectively improve the lighting uniformity of the keyswitches as well as the halo around the keycaps through the mask pattern design of the optical film, not only suitable for regular luminous keyboards, but also suitable for keyboards having the slim border design.

DETAILED DESCRIPTION OF THE PREFERRED EMBODIMENT

The invention provides a luminous keyboard and an optical module thereof to promote the lighting uniformity or the halo around the keyswitch. The luminous keyboard of the invention can be an independent keyboard or integrated into electronic devices (e.g. mobile devices, laptop computers). The luminous keyboard is not only suitable for a regular luminous keyboard, but also suitable for the luminous keyboard adopting the slim border design, but not limited thereto.

Figure 1:
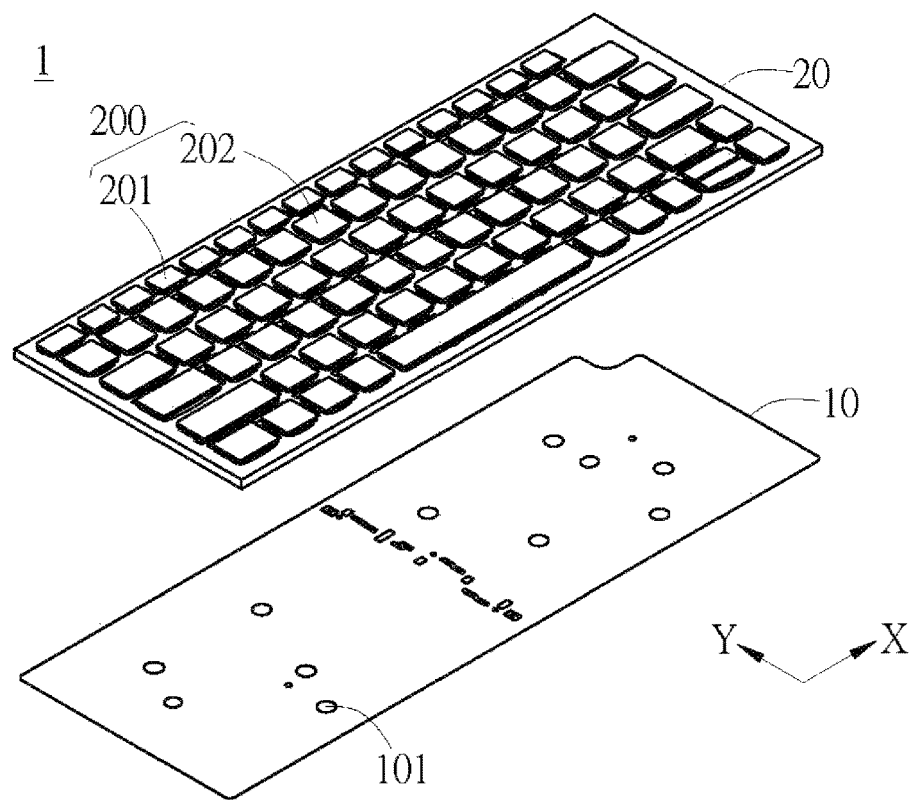
FIG. 1 is a schematic exploded view of the luminous keyboard in an embodiment of the invention.

As shown in FIG. 1, in an embodiment, the luminous keyboard 1 includes an optical module 10 and a keyswitch module 20. The optical module 10 is disposed under the keyswitch module 20. The keyswitch module 20 includes a plurality of keyswitches 200, and the plurality of keyswitches 200 include at least one outer keyswitch 201 and at least one inner keyswitch 202. In one aspect, the plurality of keyswitches 200 are arranged in multiple rows along the Y-axis direction, and the outmost keyswitches in each row, such as two keyswitches respectively at two ends in the X-axis direction, can be the outer keyswitches 201, and the keyswitches between the outer keyswitches 201 at the two ends can be the inner keyswitches 202. In another aspect, among the multiple rows of keyswitches arranged along the Y-axis direction, the keyswitches in the outmost rows (e.g. the topmost and bottommost rows in the Y-axis direction) can be the outer keyswitches 201, and the keyswitches between the outer keyswitches 201 in the outmost rows can be the inner keyswitches 202. In other words, the outer keyswitches 201 are not adjacent to other keyswitches by at least one side, such as the keyswitches disposed around the outer perimeter, and the inner keyswitches 202 are surrounded by other keyswitches at all sides. In this embodiment, the left edges of the outer keyswitches 201 at the left side (e.g. the left edges of the keycaps) are aligned along the Y-axis direction, and the right edges of the outer keyswitches 201 at the right side (e.g. the right edges of the keycaps) are aligned along the Y-axis direction, but not limited thereto. Moreover, the upper edges of the outer keyswitches 201 at the topmost row (e.g. the upper edges of the keycaps) are aligned along the X-axis direction, and the lower edges of the outer keyswitches 201 at the bottommost row (e.g. the lower edges of the keycaps) are aligned along the X-axis direction, but not limited thereto.

Figure 2:
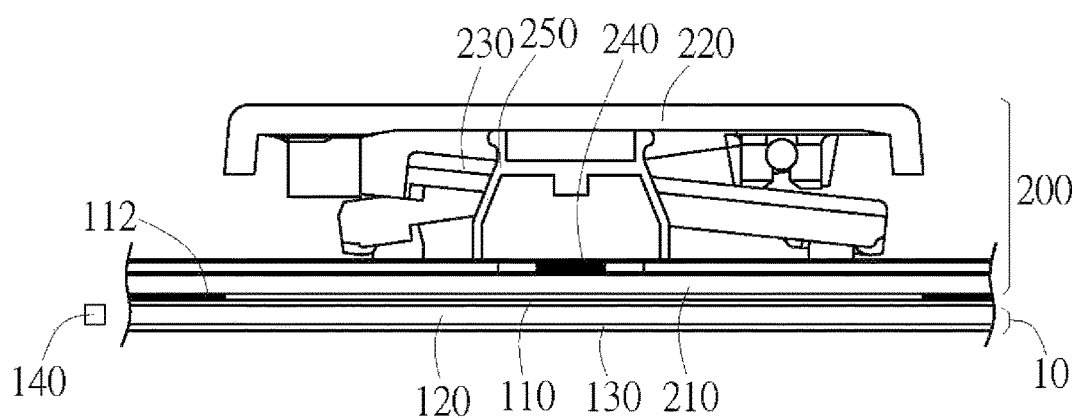
FIG. 2 is a schematic cross-sectional view of the keyswitch of the luminous keyboard in an embodiment of the invention.

Specifically, the keyswitch 200 can be any suitable key unit with light-transparent keycap. FIG. 2 is a schematic cross-sectional view of the keyswitch of the luminous keyboard in an embodiment of the invention. As shown in FIG. 2, in an embodiment, the keyswitch 200 includes the scissor-like support mechanism 230 movably coupled with the keycap 220 and the baseplate 210 to support the keycap 220 to move relative to the baseplate 210 and compress the rubber dome 250 to trigger the switch layer 240 (e.g. membrane switch), and the rubber dome 250 is configured to provide the restoring force to enable the keycap 210 to return to its original position, but not limited thereto. In other embodiments, the scissor-like support mechanism 230 can be replaced with other up-down support mechanisms, such as butterfly-type support mechanism, sliding block support mechanism, suspension arm support mechanism, and the like. The rubber dome 250 can be replaced with other restoring units, such as magnets, spring, and the like. Moreover, the switch layer 240 can be replaced with other switch units, such as mechanical switch, optical switch, and the like. That is, the keyswitches 200 of the keyswitch module 20 can have any suitable configuration, which can generate the triggering signal after being pressed. When the plurality of keyswitches 200 are integrated into the keyboard, components of the keyswitches 200 (e.g. switch layer 240, rubber dome 250, baseplate 210) can be respectively integrated into a single component to facilitate the convenience of assembly, but not limited thereto.

Figure 3:
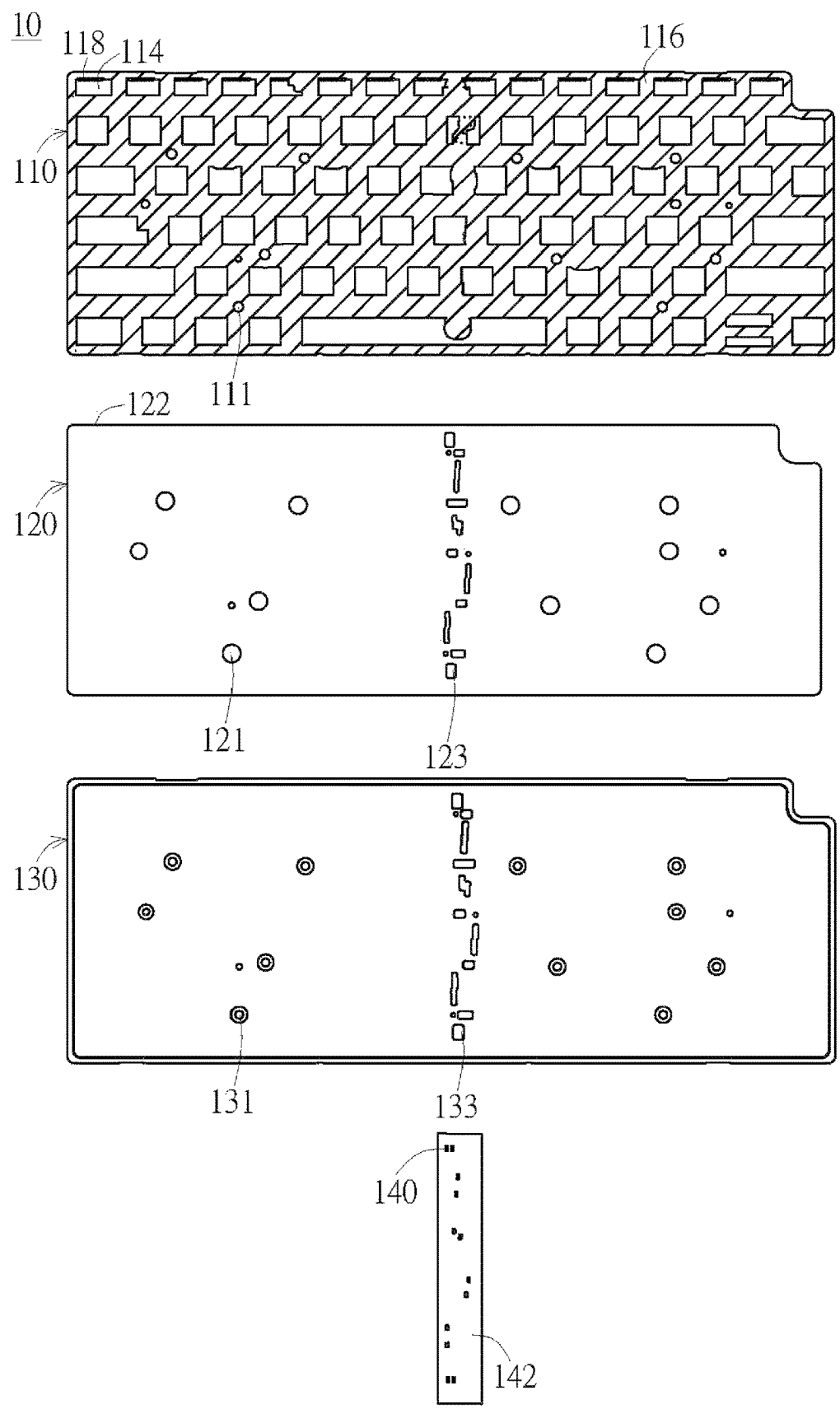
FIG. 3 is a plane view of components of the optical module in an embodiment of the invention.

FIG. 3 is a plane view of components of the optical module 10 in an embodiment of the invention. As shown in FIGS. 2 and 3, in an embodiment, the optical module 10 includes an optical film 110, a light guide sheet 120, a reflective film 130, and a light source 140. The light source 140 provides light. The light guide sheet 120 is disposed on one side (e.g. lower side) of the optical film 110 and configured to guide the light to emit through the plurality of keyswitches (e.g. 200). For example, the optical film 110 is disposed on one side (e.g. upper side) of the light guide sheet 120 adjacent to the baseplate 210. The optical film 110 has a mask pattern 112 to selectively allow light to pass therethrough and block light. The reflective film 130 is disposed on another side (e.g. lower side) of the light guide sheet 120 opposite to the optical film 110. The reflective film 130 is configured to reflect the light emitting from the lower surface of the light guide sheet 120 back to the light guide sheet 120.

Specifically, the light source 140 is preferably a light-emitting diode (LED), such as a side-lighting LED, but not limited thereto. The light emitting surface of the light source 140 preferably faces the light-input surface of the light guide sheet 120, so that the light enters the light guide sheet 120 from the light-input surface. In an embodiment, a plurality of light sources 140 are preferably integrated on a circuit board 142 to form an integrated light source unit, so as to enhance the assembly efficiency.

The light guide sheet 120 can be a film-like or sheet-like plate, which can be made of any suitable optical materials, such as optical polymers. The light guide sheet 120 is configured to receive the light emitted from the light source 140. The size of the light guide sheet 120 corresponds to the size of the keyswitch module 20 and is slightly smaller than that of the optical film 110. For example, the size of the light guide sheet 120 in the X-axis direction and/or the Y-axis direction is preferably smaller than the size of the optical film 110, so that the edge of the optical film 110 extend beyond the light guide sheet 120, facilitating the adhesion with other components, such as the reflective film 130, the baseplate 210, but not limited thereto. In this embodiment, the light guide sheet 120 has a plurality of light source holes 123, and the lateral surface inside the light source hole 123 which is, for example, parallel to the Y-Z plane can be the light-input surface of the light guide sheet 120. The top surface of the light guide sheet 120 (i.e., the upper surface that extends along the X-Y plane) can be the light-output surface of the light guide sheet 120. The light guide sheet 120 has an edge 122 to define the boundary of the light-input surface. For example, the edge of the light guide sheet 120 is a boundary line extending along the X-axis direction and the Y-axis direction and surrounding the light-emitting surface.

The reflective film 130 can be a reflective film made of reflective materials (e.g. metal foil), a layer of reflective material coated on a non-reflective film, or a plastic film doped with reflective particles (e.g. PET film doped with reflective particles). The shape and size of the reflective film 130 preferably correspond to those of the optical film 110, and the malleability/deformability of the reflective sheet 130 is preferably larger than that of the optical film 110. In other words, the reflective film 130 is much more deformable than the optical film 110, so that the reflective film 130 is readily to be adhered. In this embodiment, the reflective film 130 has a plurality of holes 133 corresponding to the light source holes 123 of the light guide sheet 120, so that the light source 140 can extend into the light source hole 123 from the bottom of the reflective sheet 130 through the hole 133. As such, the light provided by the light source 140 enters the light guide sheet 120 from the light-input surface inside the light source hole 123, substantially travels along the extending direction of the light guide sheet 120, and then emits out from the light-transparent regions (e.g. 114, described later) of the optical film 110.

In an embodiment, the optical film 110 can be a light-transparent optical film (e.g. polyethylene terephthalate (PET) film) with light-shielding material (e.g. ink) disposed thereon to form the mask pattern 112, but not limited thereto. In another embodiment, the optical film 110 can be an opaque optical film, which is processed (e.g. cut) to form the mask pattern 112. In an embodiment, the mask pattern 112 of the optical film 110 defines one or more light-transparent regions 114, a light-shielding region 116, and one or more light modulation regions 118. For example, the light-transparent region 114 is a region of the light-transparent optical film without the light-shielding material disposed thereon. The light-shielding region 116 is a region of the light-transparent optical film with the light-shielding material disposed thereon. The light modulation region 118 extends from the light-shielding region 116 to the light-transparent region 114 to at least partially modulate the light energy between the light-shielding region 116 and the light-transparent region 114. In this embodiment, the mask pattern 112 defines a plurality of light-transparent regions 114, and the plurality of light-transparent regions 114 correspond to the plurality of keyswitches 200, respectively. For example, the number and location of the light-transparent regions 114 preferably correspond to those of the keyswitches 200, and the shape of the light-transparent region 114 preferably corresponds to the shape of the keycap 220, but not limited thereto. In an embodiment, the shape and size of the optical film 110 preferably correspond to those of the baseplate 210 of the keyswitch module 20, so that the upper surface of the end portion of the optical film 110 is adhered to the lower surface of the baseplate 210, and the lower surface of the end portion of the optical film 110 is adhered to the upper surface of the reflective film 130. As such, the light guide sheet 120 is enclosed between the optical film 110 and the reflective film 130 to prevent lateral light leakage. Moreover, in an embodiment, the edges of the keycap 220 of the outer keyswitch 201 and the baseplate 210 can be aligned with the edges of the optical film 110 and the reflective film 130. For example, the edges of the keycap 220, the baseplate 210, the optical film 110, and the reflective film 130 are aligned with each other along the stacking direction (e.g. the Z-axis direction) to facilitate the slim border design of the luminous keyboard 1. In an embodiment, the size and shape of the light-transparent region 114 corresponding to the inner keyswitch 202 is preferably consistent with those of its corresponding keycap 220, i.e., the vertical projections of the light-transparent region 114 and the keycap 220 on the baseplate 210 are substantially completely overlapped with each other. The size and shape of the light-transparent region 114 corresponding to the outer keyswitch 201 is limited by the considerations of adhesion requirements and lateral light leakage, so the size of the light-transparent region 114 corresponding to the outer keyswitch 201 is smaller than its corresponding keycap 220. In other words, in each keyswitch 200, the vertical projection of the keycap 220 on the optical film 110 at least partially covers its corresponding light-transparent region 114.

The light modulation region 118 can be selectively disposed at location corresponding to one or more keyswitches that require light modulation. For example, as shown in FIGS. 1 and 3, when the outer keyswitches 201 at the topmost row require light modulation, the light modulation regions 118 can be disposed along the X-axis direction to respectively correspond to the light-transparent regions 114. The light modulation region 118 extends from the light-shielding region 116 to the light-transparent region 114. The light-transparent region 114 allows light to pass therethrough. The light-shielding region 116 blocks light. The light modulation region 118 partially allows light to pass therethrough and partially blocks light, so that the light modulation region 118 has an average amount of light-transmitted per unit area smaller than that of the light-transparent region 114 and larger than that of the light-shielding region 116. Hereinafter, referring to FIGS. 4A to 10B, various embodiments of the configuration of the mask pattern of the optical film for a single keyswitch will be illustrated.

Figure 4A:
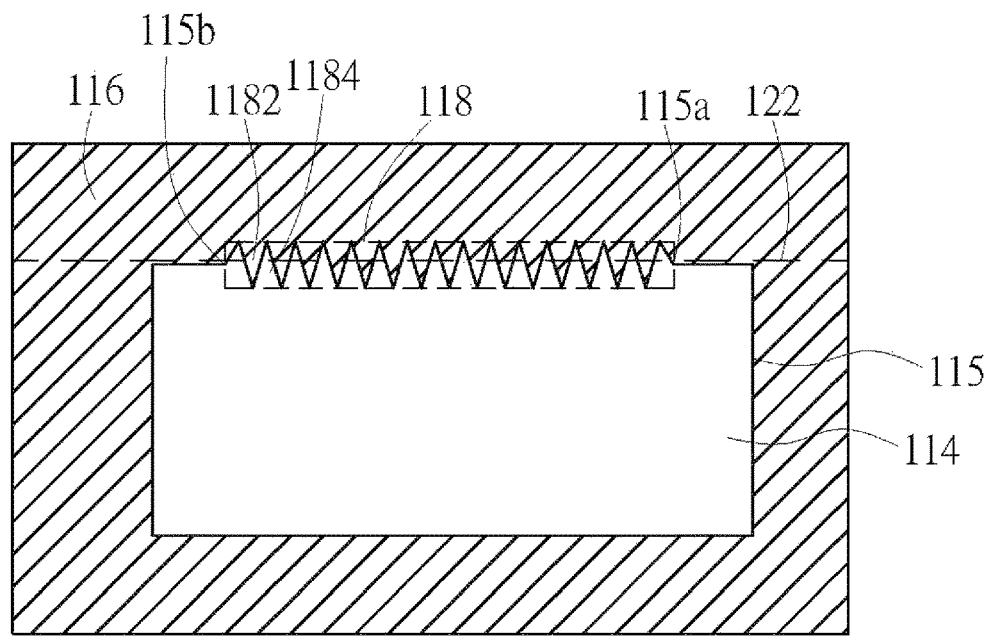
FIG. 4A is a schematic view of the first embodiment of the invention, showing the relative position of the mask pattern of the optical film and the light guide sheet.

As shown in FIG. 4A, in the first embodiment, the light-shielding region 116 partially surrounds the light-transparent region 114 to form a boundary line 115 between the light-shielding region 116 and the light-transparent region 114, and two ends 115a, 115b of the boundary line 115 are substantially connected to middle sections of two opposite sides of the light modulation region 118. For example, the light-shielding region 116 can be considered as surrounding and adjoining the light-transparent region 114 to substantially form a rectangular boundary line 115, and the light modulation region 118 extends between the light-shielding region 116 and the light-transparent region 114 across a portion of the boundary line 115, so that the middle sections of both sides of the light modulation region 118 are respectively connected to the two ends 115a and 115b of the boundary line 115. In an embodiment, the light modulation region 118 includes a plurality of light-shieling sub-regions 1182 and a plurality of light-transparent sub-regions 1184. The plurality of light-shielding sub-regions 1182 and the plurality of light-transparent sub-regions 1184 are alternatingly disposed, for example, along the edge 122 of the light guide sheet 120 or along the extending direction of the boundary line 115. Specifically, the plurality of light-shielding sub-regions 1182 are the regions where the light-shielding material is disposed in the light modulation region 118, and the plurality of light-transparent sub-regions 1184 are the regions where the light-shielding material is not disposed in the light modulation region 118. In other words, in the optical film 110, the light-shielding material is disposed at the light-shielding region 116 (e.g. gaps between adjacent keyswitches or border of the keyboard) and the plurality of light-shielding sub-regions 1182 to constitute the mask pattern 112. In an embodiment, each of the plurality of light-shielding sub-regions 1182 has a first end and a second end opposite to the first end. The first end is connected to the light-shielding region 116, and the second end extends to the light-transparent region 114. For example, the plurality of light-shielding sub-regions 1182 may have a same shape and a same size, and each light-shielding sub-region 1182 extends from the light-shielding region 116 to the light-transparent region 114, but not limited thereto. According to practical applications, the shape, size, and number of the light-shielding sub-regions 1182 may be different.

Figure 4B:
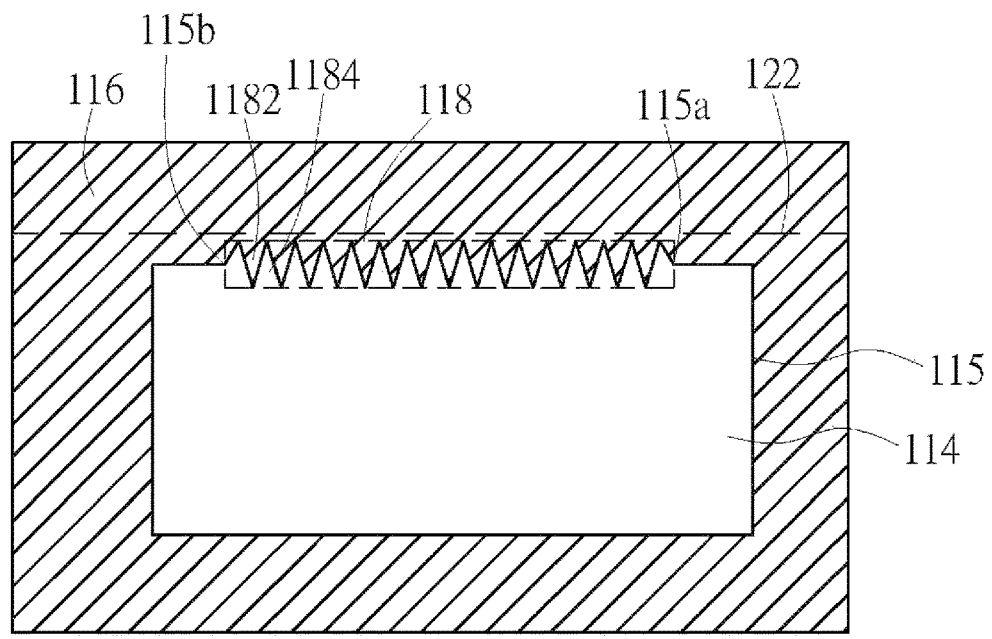
FIG. 4B is a variant embodiment of FIG. 4A.

In this embodiment, the light-shielding sub-region 1182 has a triangle shape, so that the width of the first end of the light-shielding sub-region 1182 (i.e., the end adjacent to the light-shielding region 116) is larger than that of the second end (i.e., the end adjacent to the light-transparent region 114), and the width of the light-shielding sub-region 1182 is gradually reduced from the light-shielding region 116 to the light-transparent region 114. In other words, the wider bottom side of the triangular light-shielding sub-region 1182 is connected to the light-shielding region 116, and the light-shielding sub-region 1182 extends across the virtual connecting line between the two ends 115a and 115b of the boundary line 115, so that the vertex point of the triangular light-shielding sub-region 1182 points into the light-transparent region 114. The triangular light-shielding sub-regions 1182 are arranged along the edge 122 of the light guide sheet 120, so that one triangular light-transparent sub-region 1184 is located between two adjacent light-shielding sub-regions 1182, or one triangular light-shielding sub-region 1182 is located between two adjacent light-transparent sub-regions 1184. Correspondingly, the light-transparent sub-region 1184 has a similar triangular shape, so that the wider bottom side of the triangular light-transparent sub-region 1184 is proximate to the light-transparent region 114, and the vertex of the triangular light-transparent sub-region 1184 is proximate to the light-shielding region 116. In such a configuration, the average amount of light-transmitted per unit area of the light modulation region 118 is increased from the light-shielding region 116 to the light-transparent region 114. For example, "the average amount of light-transmitted per unit area of the light modulation region 118 is increased from the light-shielding region 116 to the light-transparent region 114" is referred to that the width of the light-transparent sub-region 1184 is increased from the light-shielding region 116 to the light-transparent region 114, or the area ratio of the light-transparent sub-region 1184 to the light-shielding sub-region 1182 (i.e. ratio of light-transmitting area of the light modulation region 118) is increased from the light-shielding region 116 to the light-transparent region 114. When the optical film 110, the light guide sheet 120, and the reflective film 130 are stacked on one another, the vertical projection of the edge 122 of the light guide sheet 120 on the optical film 110 at least partially falls within the light modulation region 118. As such, the light-shielding sub-regions 1182 of the light modulation region 118 shield the light emitted from the edge 122 of the light guide sheet 120, and the light-transparent sub-regions 1184 of the light modulation region 118 allow the light emitted from the edge 122 of the light guide sheet 120 to pass therethrough, so that the light emitted from the edge 122 of the light guide sheet 120 can be modulated by 13 the optical film 110 to improve the lighting uniformity of the keyswitch and enhance the applicability of the slim border design to keyboards As shown in FIG. 4B, in a variant embodiment, the relative position of the mask pattern 112 of the optical film 110 and the light guide sheet 120 is illustrated. In this embodiment, the mask pattern 112 of the optical film 110 defines the light-transparent region 114, the light-shielding region 116, and the light modulation region 118 similar to those of FIG. 4A. The difference between FIG. 4B and FIG. 4A is in that when the optical film 110, the light guide sheet 120, and the reflective film 130 are stacked on one another, the vertical projection of the edge 122 of the light guide sheet 120 on the optical film 110 at least partially falls within the light-shielding region 116 adjacent to the light modulation region 118. As such, the light-shielding region 116 of the optical film 110 substantially fully shields the light emitted from the edge 122 of the light guide sheet 120, and the light-transparent sub-regions 1184 of the light modulation region 118 allow a portion of light emitted from the light guide sheet 120 to pass therethrough, so as to modulate the lighting uniformity. In other words, the distance (or relative position) between the edge 122 of the light guide sheet 120 and the light modulation region 118 can be modified according to practical lighting effects. When it requires to utilize more light emitted from the edge 122 of the light guide sheet 120, a design similar to FIG. 4A can be adopted, otherwise a design similar to FIG. 4B can be adopted.

Figure 5A:
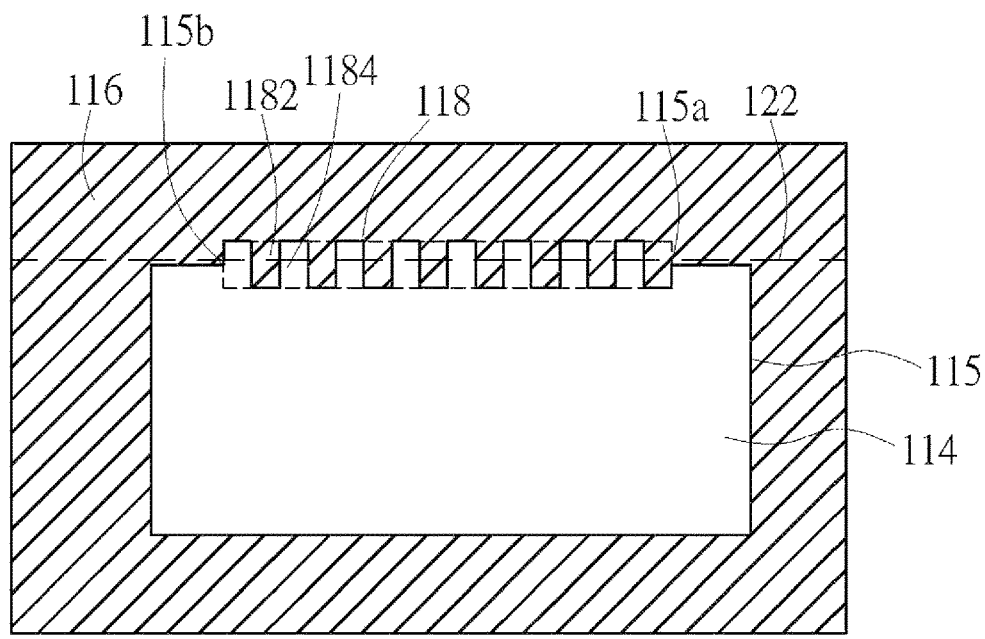
FIG. 5A is a schematic view of the second embodiment of the invention, showing the relative position of the mask pattern of the optical film and the light guide sheet.
Figure 5B:
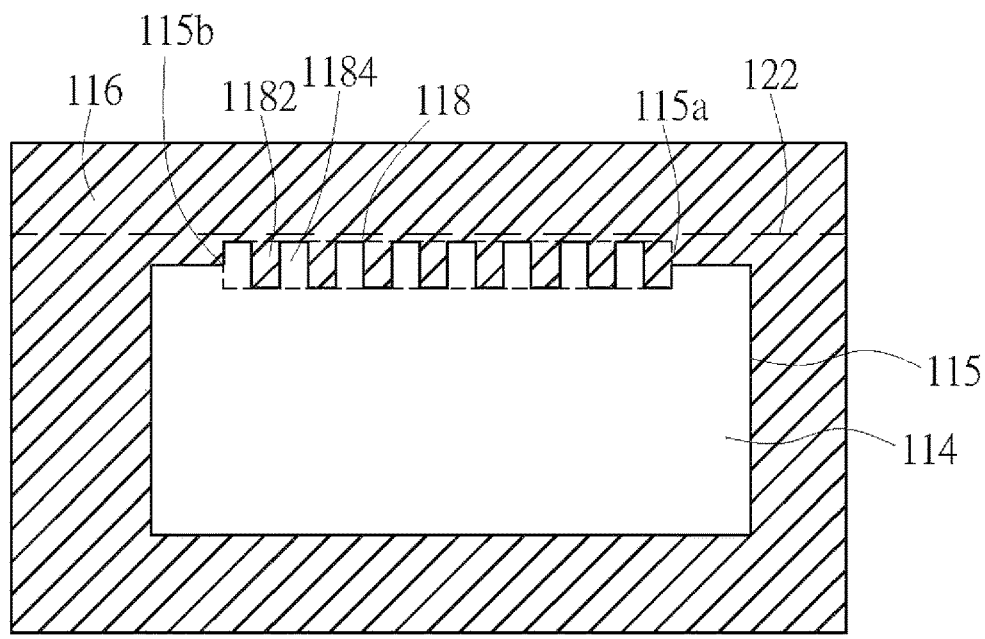
FIG. 5B is a variant embodiment of FIG. 5A.

As shown in FIGS. 5A and 5B, the mask pattern 112 of the optical film 110 in the second embodiment is illustrated. The light modulation region 118 includes a plurality of light-transparent sub-regions 1184 and a plurality of light-shielding sub-regions 1182. The plurality of light-transparent sub-regions 1184 and the plurality of light-shielding sub-regions 1182 are alternatingly disposed along the edge 122 of the light guide sheet 120 (or along the extending direction of the boundary line 115). Hereinafter, the differences between the embodiments and the previous embodiments will be explained, and other details can refer to the related descriptions of the previous embodiments and will not elaborate again. In FIGS. 5A and 5B, the light-shielding region 1182 is in the form of rectangle, so that the width of the first end is equal to the width of the second end. The plurality of light-shielding sub-regions 1182 are disposed at intervals along the edge 122 of the light guide sheet 120, so that one light-transparent sub-region 1184 is located between two adjacent light-shielding sub-regions 1182. Correspondingly, the light-transparent sub-region 1184 is in the form of rectangle, and the average amount of light-transmitted per unit area of the light modulation region 118 substantially maintains constant from the light-shielding region 116 to the light-transparent region 114. In other words, the width of the light-transparent sub-region 1184 substantially maintains constant from the light-shielding region 116 to the light-transparent region 114, or the area ratio of the light-transparent sub-region 1184 to the light-shielding sub-region 1182 (i.e. ratio of light-transmitting area of the light modulation region 118) substantially maintains constant from the light-shielding region 116 to the light-transparent region 114. Moreover, in FIG. 5A, the vertical projection of the edge 122 of the light guide sheet 120 at least partially falls within the light modulation region 118, and in FIG. 5B, the vertical projection of the edge 122 of the light guide sheet 120 falls within the light-shielding region 116 and adjacent to the light modulation region 118. The distance (or relative position) between the edge 122 of the light guide sheet 120 and the light modulation region 118 can be modified according to practical lighting effects to adopt a design similar to FIG. 5A or FIG. 5B.

Figure 6:
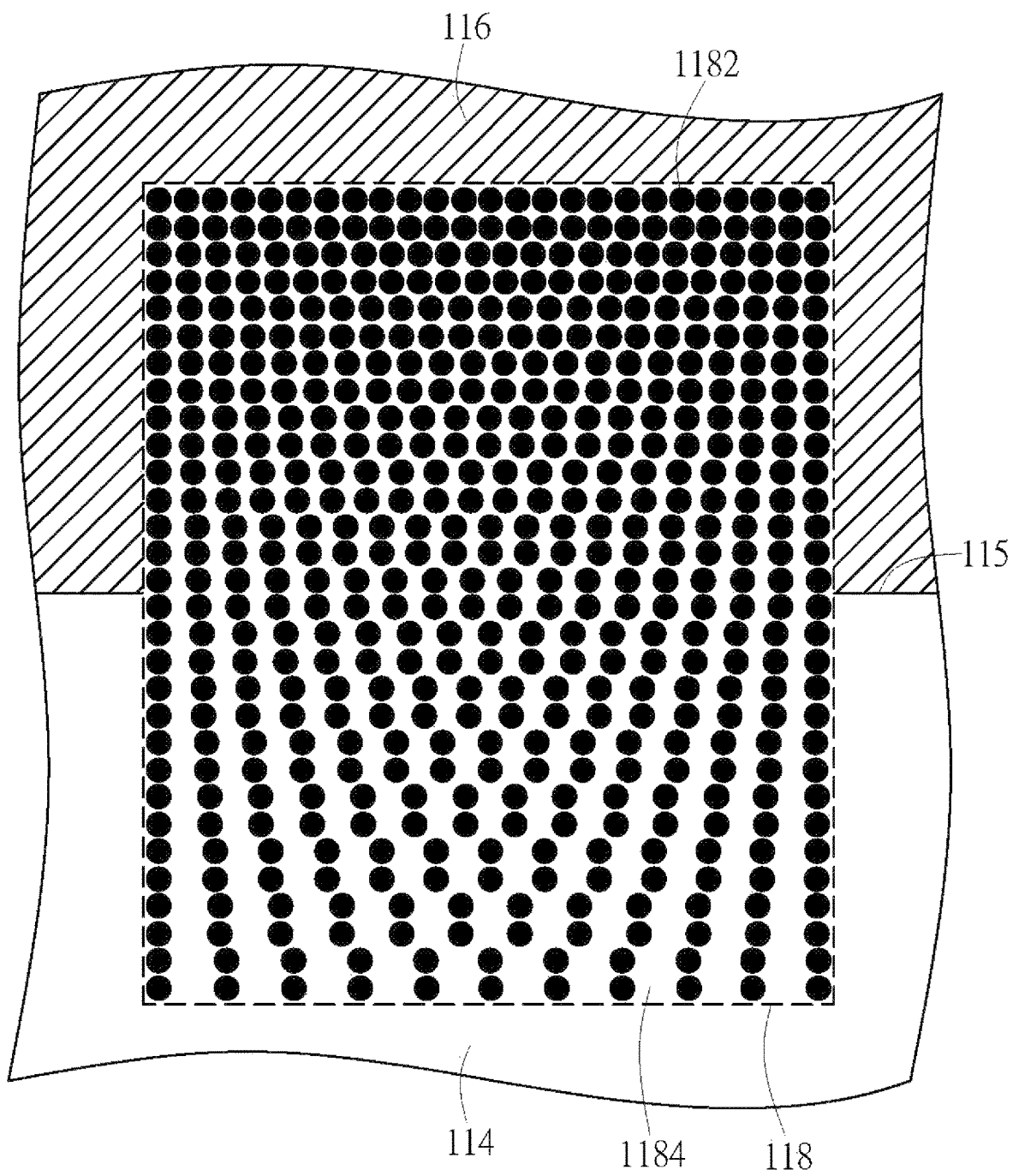
FIG. 6 is a schematic view of the light modulation region of the optical film in a variant embodiment.

In the above embodiments, the light modulation region is illustrated with the light-transparent sub-regions and the light-shielding sub-regions in the form of triangle or rectangle, but not limited thereto. In another embodiment (not shown), the light-transparent sub-regions and the light-shielding sub-regions may have any suitable shape, such as trapezoid, but not limited thereto. In other embodiments, according to practical applications, the light modulation region may have a gradation design by printing technology, so that the light-transmitting rate of the light modulated region 118 is increased along the extending direction from the light-shielding region 116 toward the light-transparent region 114. As shown in FIG. 6, the light-shielding material disposed on the light modulation region 118 is arranged in a dot configuration to form the plurality of light-shielding sub-regions 1182 in dot shape, and the portion of the light modulation region 118 without the light-shielding material disposed thereon forms the plurality of light-transparent sub-regions 1184. In this embodiment, the light-shielding sub-regions 1182 are arranged in dots, and the distribution density of the light-shielding sub-regions 1182 is reduced from the light-shielding region 116 to the light-transparent region 114. In other words, the distribution density of the light-shielding sub-regions 1182 becomes larger as closer to the light-shielding region 116 and becomes smaller as closer to the light-transparent region 114, but not limited thereto. In other embodiments, according to practical applications and the optical requirements, the plurality of light-shielding sub-regions may be locally overlapped with each other, and the sizes of the dots (i.e., the light-shielding sub-regions) may be different.

Figure 7A:
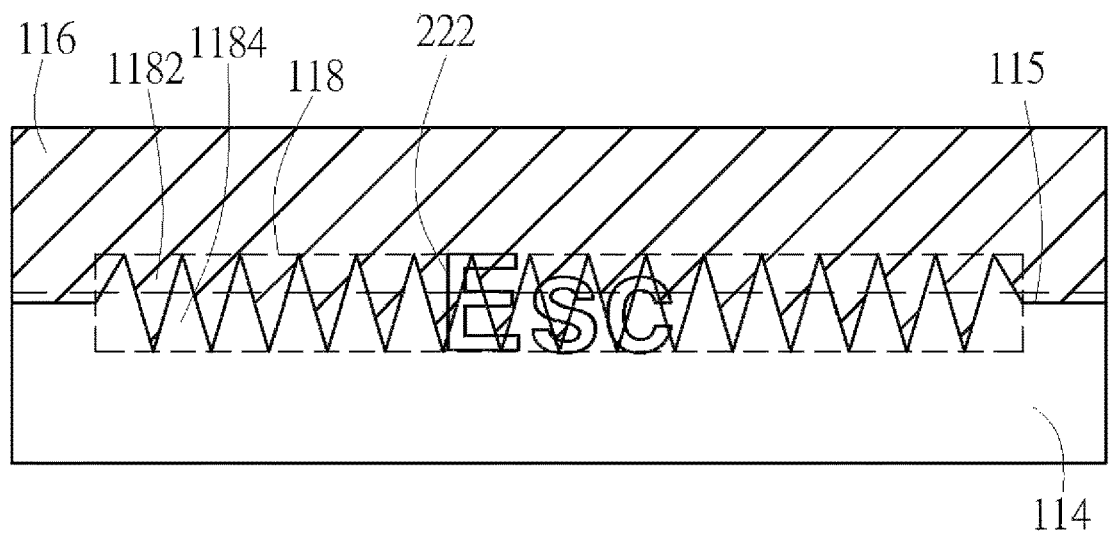
FIG. 7A is a schematic view of an embodiment of the invention, showing the relative position of the light modulation region of the optical film and the light-transparent portion of the keycap.
Figure 7B:
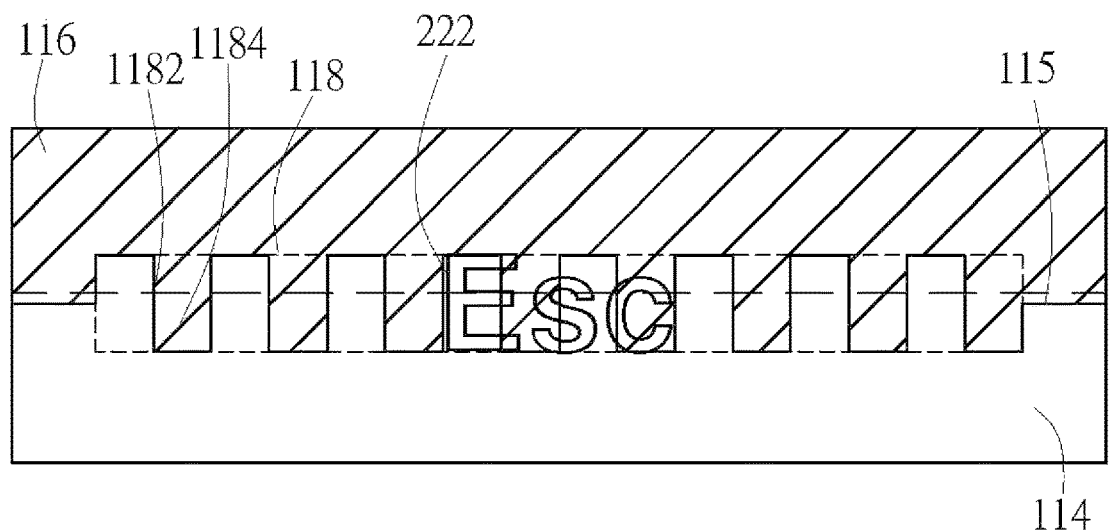
FIG. 7B is a variant embodiment of FIG. 7A.

As shown in FIGS. 7A and 7B, the relative position of the light modulation region 118 of the optical films 110 of FIGS. 4A and 5A and the light-transparent portion 222 of the keycap 220 are illustrated, respectively. In FIGS. 7A and 7B, the light-transparent portion 222 of the keycap 220 are illustrated with the symbol of "Esc" as an example. The plurality of light-shielding sub-regions 1182 and the plurality of light-transparent sub-regions 1184 of the light modulation region 118 are alternately arranged along an extending direction (or disposing position) of the light-transparent portion 222. In other words, the plurality of light-shielding sub-regions 1182 and the plurality of light-transparent sub-regions 1184 are preferably alternatingly arranged along the longitudinal direction of the light-transparent portion 222. In an embodiment, the length of the light modulation region 118 extending from the light-shielding region 116 to the light-transparent region 114 and the width of the light modulation region 118 extending along the extending direction of the boundary line 115 are preferably at least equal to the height and the width of the light-transparent portion 222. In other words, the light modulation region 118 preferably covers the entire light-transparent portion 222 in the length and width directions. The boundary line 115 is preferably connected to the light modulation region 118 at ½ of the height of the light-transparent portion 222.

Figure 8:
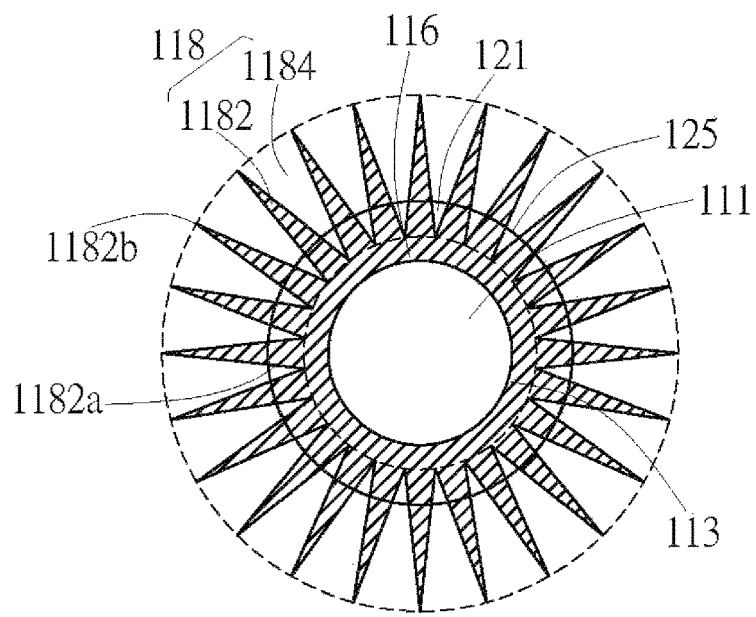
FIG. 8 is a schematic view of the third embodiment of the invention, showing the relative position of the mask pattern of the optical film and the light guide sheet.

Moreover, as shown in FIGS. 1 and 3, for heat dissipation and positioning purposes, the optical module 10 generally has one or more through holes 101 to allow air flow or positioning means (e.g. bolts or screws) to pass therethrough. As shown in FIG. 3, the optical film 110 has an upper hole 111. The light guide sheet 120 has a hole 121. The reflective film 130 has a lower hole 131. When the optical film 110, the light guide sheet 120, and the reflective film 130 are stacked on one another (i.e., sequentially stacked from top to bottom), the upper hole 111, the hole 121, and the lower hole 131 are aligned and communicate with each other to form the through hole 101. When the through hole 101 is at least partially located within the vertical projection of the keyswitch 200, the light modulation region 118 can be disposed at a position corresponding to the keyswitch 200. As shown in FIG. 8, the hole 121 of the light guide sheet 120 has an edge 125. The edge 113 of the upper hole 111 of the optical film 110 is located at the inner side of the edge 125 of the hole 121 of the light guide sheet 120. In other words, the diameter of the upper hole 111 is smaller than that of the hole 121, so that a portion of the optical film 110 around the upper hole 111 that protrudes into the hole 121 forms the light-shielding region 116 of a ring-like shape. The plurality of light-shielding sub-regions 1182 and the plurality of light-transparent sub-regions 1184 of the light modulation region 118 are alternately disposed along the edge 125 of the hole 121 of the light guide sheet 120, and extend from the light-shielding region 116 to the light-transparent region 114. Specifically, according to the actual location of the through hole 101 corresponding to the keycap 220, the light modulation region 118 can fully surround the through hole 101 to form a complete ring shaped region or partially surround the through hole 101 to form a sector region. In this embodiment, the light modulation region 118 is illustrated to substantially completely surround the light-shielding region 116, i.e., the through hole 101 is substantially located completely in the light-transparent region 114 corresponding to the keycap 220, so that the light-transparent region 114 can be the peripheral region surrounding the light modulation region 118, but not limited thereto. In another embodiment, the light modulation region 118 can be a sector region which partially surrounds the light-shielding region 116, i.e., the through hole 101 is partially located in the light-transparent region 114 corresponding to the keycap 220, so that the light-transparent region 114 can be the sector peripheral region surrounding the outer edge of the light modulation region 118, and the light-shielding region 116 is connected to the lateral sides of the sector region and extends to the inner edge of the light modulation region 118.

In this embodiment, each light-shielding sub-region 1182 has a triangle-like shape. The first end 1182a of the light-shielding sub-region 1182 is connected to the light shielding region 116, and the second end 1182b of the light-shielding sub-region 1182 extends to the light-transparent region 114. The width of the first end 1182a is larger than that of the second end 1182b, so that the width of the light-shielding sub-region 1182 is gradually reduced from the light-shielding region 116 to the light-transparent region 114. In this embodiment, the central line of the second end 1182b of the light-shielding sub-region 1182 (e.g. angle bisector) preferably runs through the centers of the hole 121 and the upper hole 111. The plurality of light-shielding sub-regions 1182 are preferably arranged along the edge 125 of the hole 121 of the light guide sheet 120, so that one light-transparent sub-region 1184 is located between two adjacent light-shielding sub-regions 1182. Correspondingly, the light-transparent sub-region 1184 has a triangle-like shape. Because the light modulation region 118 surrounds the light-shielding region 116 and extends radially outward toward the light-transparent region 114, the wider bottom side of the light-transparent sub-region 1184 is proximate to the light-transparent region 114 and has an arc length larger than the arc length of the first end 1182a of the light-shielding sub-region 1182. The vertex of the light-transparent sub-region 1184 is proximate to the light-shielding region 116, so that the average amount of light-transmitted per unit area of the light modulation region 118 is increased from the light-shielding region 116 to the light-transparent region 114. In this embodiment, when the optical film 110, the light guide sheet 120, and the reflective film 130 are stacked on one another, the vertical projection of the edge 125 of the hole 121 of the light guide sheet 120 on the optical film 110 at least partially falls within the light modulation region 118, so that the lighting uniformity of the keyswitch 200 which corresponds to the through hole 101 can be enhanced by the light modulation region 118.

Figure 9:
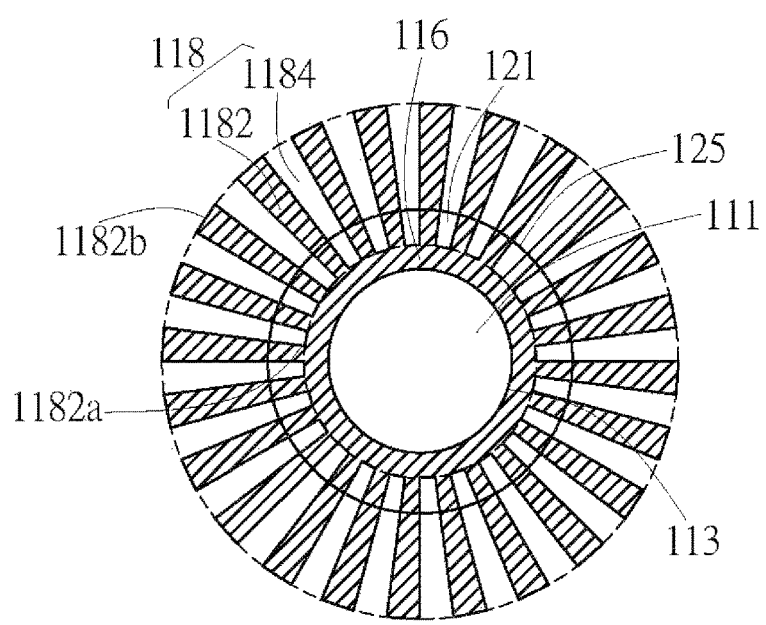
FIG. 9 is a schematic view of the fourth embodiment of the invention, showing the relative position of the mask pattern of the optical film and the light guide sheet.

FIG. 9 is a variant embodiment of FIG. 8. In this embodiment, the light-shielding sub-region 1182 has a sector shape, wherein the extending directions of two lateral sides of the sector preferably run through the centers of the hole 121 and the upper hole 111. In this embodiment, because the light modulation region 118 surrounds the light-shielding region 116 and extends radially outward toward the light-transparent region 114, the width of the first end 1182a of the light-shielding sub-region 1182 is smaller than that of the second end 1182b, and the width of the light-shielding sub-region 1182 is gradually increased from the light-shielding region 116 to the light-transparent region 114. In other words, the plurality of light-shielding sub-regions 1182 are arranged at intervals along the edge 125 of the hole 121 of the light guide sheet 120, so that one light-transparent sub-region 1184 is located between two adjacent light-shielding sub-regions 1182. Correspondingly, the light-transparent sub-region 1184 is in the form of sector, and the width of light-transparent sub-region 1184 is gradually increased from the light-shielding region 116 to the light-transparent region 114. The area ratio of the light-transparent sub-region 1184 to the light-shielding sub-region 1182 of the light modulation region 118 substantially maintains the same from the light-shielding region 116 to the light-transparent region 114, but the light-transmitting area of the light modulation region 118 is gradually increased as the distance from the light-shielding region 116 increases. In this embodiment, when the optical film 110, the light guide sheet 120, and the reflective film 130 are stacked on one another, the vertical projection of the edge 125 of the hole 121 of the light guide sheet 120 on the optical film 110 at least partially falls within the light modulation region 118, so that the lighting uniformity of the keyswitch 200 which corresponds to the through hole 101 can be enhanced by the light modulation region 118.

Moreover, the design of the light modulation region 118 of FIG. 8 or 9 can be applied to a corner portion of the keyswitch. In such a case, the optical film 110 may not have the upper hole 111, and the light-shielding region 116 of the optical film 110 extends to the location where the upper hole 111 would be disposed, so that the lighting uniformity of the keyswitch at the corner portion can be enhanced. Moreover, in the embodiments of FIGS. 8 and 9, the number, shape, and size of the light-shielding sub-region 1182 (or the light-transparent sub-region 1184) of the light modulation region 118 can be modified according to practical needs, such as light intensity, light leakage level.

Figure 10A:
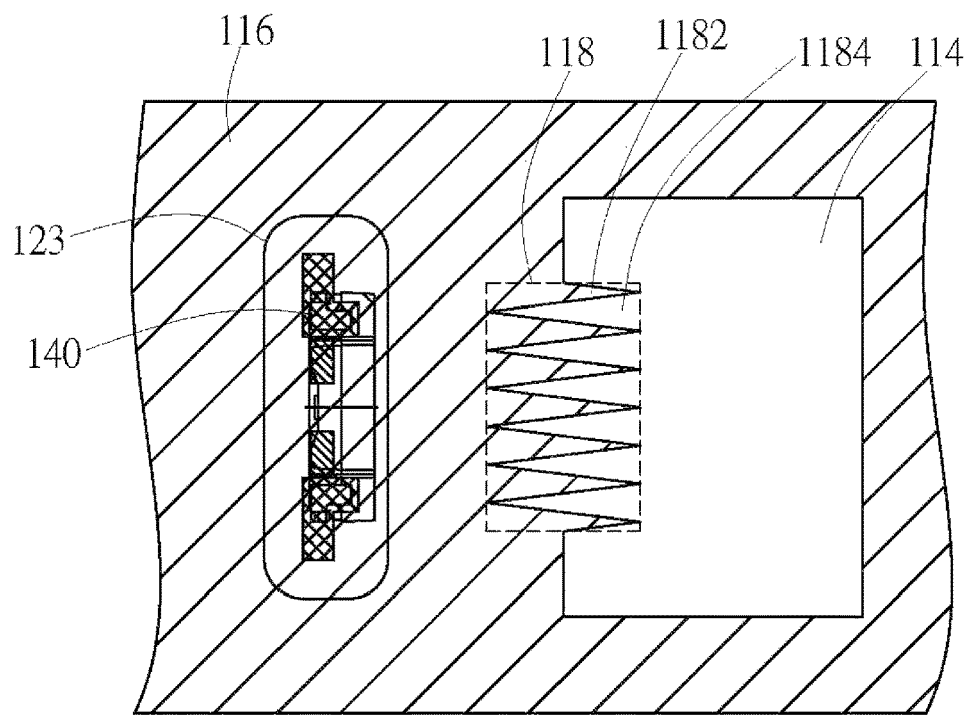
FIG. 10A is a schematic view of the fifth embodiment of the invention, showing the relative position of the mask pattern of the optical film and the light source.
Figure 10B:
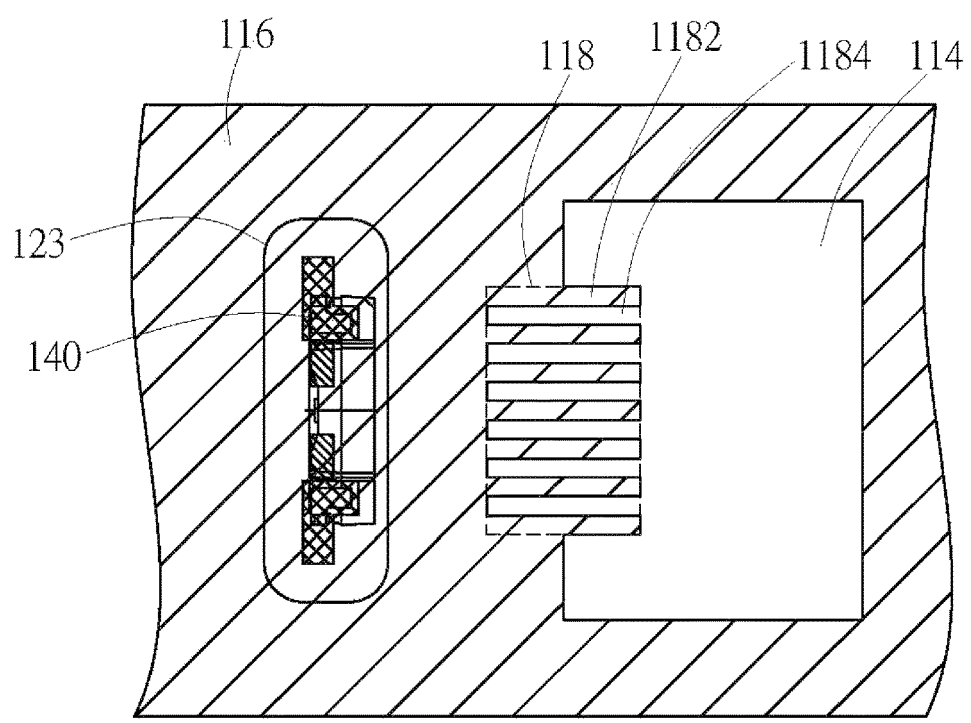
FIG. 10B is a variant embodiment of FIG. 10A.

FIG. 10A is a schematic view of the fifth embodiment of the invention, which shows the relative position of the mask pattern 112 of the optical film 110 and the light source 120. FIG. 10B is a variant embodiment of FIG. 10A. As shown in FIGS. 10A and 10B, the light source 140 is disposed in the light source hole 123 of the light guide sheet 120, and the optical film 110 is disposed on the light guide sheet 120 and covers the light source hole 123 (and the light source 140). When the light source 140 is disposed adjacent to the keyswitch 200, the light modulation region 118 can be disposed at a location of the optical film 110 which corresponds to the keyswitch 200, so as to modulate the lighting uniformity of the keyswitch 200. For example, the light shielding region 116 extends to cover the light source hole 123 (and the light source 140), and the light modulation region 118 can be disposed corresponding to the light-emitting surface of the light source 140 and extend from the light-shielding region 116 to the light-transparent region 114, i.e., the light modulation region 118 is located between the light-transparent region 114 and the light-emitting surface of the light source 140. The plurality of light-shielding sub-regions 1182 and the plurality of light-transparent sub-regions 1184 of the light modulation region 118 are alternatingly disposed along the light-emitting surface of the light source 140. In the embodiment of FIG. 10A, the light modulation region 118 has a configuration similar to FIG. 4A, wherein the width of the light-shielding sub-region 1182 is gradually reduced from the light-shielding region 116 to the light-transparent region 114, and the average light-transmitting rate per unit area of the light modulation region 118 is increased from the light-shielding region 116 to the light-transparent region. In the embodiment of FIG. 10B, the light modulation region 118 has a configuration similar to FIG. 5A, wherein the width of the light-shielding sub-region 1182 substantially maintains the same from the light-shielding region 116 to the light-transparent region 114, and the average light-transmitting rate per unit area of the light modulation region 118 substantially maintains the same from the light-shielding region 116 to the light-transparent region. In practical applications, the number, shape, and size of the light-shielding sub-region 1182 (or the light-transparent sub-region 1184) of the light modulation region 118 can be modified according to the desired light intensity, the distance between the light-transparent region 114 and the light source 110, the location of light-transparent portion 222 of the keycap 220, and the like to achieve the desired optical effect.

It is noted that in other embodiments, one or more arrangements of the light modulation region of the above various embodiments can be optionally integrated into a single luminous keyboard, so as to improve the lighting uniformity of the luminous keyboard by modulating the brightness of the desired keyswitch(es), such as the outer keyswitch, the keyswitch adjacent to the through hole and/or the light source.

Although the preferred embodiments of the invention have been described herein, the above description is merely illustrative. The preferred embodiments disclosed will not limit the scope of the invention. Further modification of the invention herein disclosed will occur to those skilled in the respective arts and all such modifications are deemed to be within the scope of the invention as defined by the appended claims.

What is claimed is:

1. An optical module for a luminous keyboard, comprising: a light guide sheet; a reflective film on one side of the light guide sheet; and an optical film on another side of the light guide sheet opposite to the reflective film, the optical film having a mask pattern, the mask pattern defining a light-transparent region, a light-shielding region, and a light modulation region, the light modulation region extending from the light-shielding region to the light-transparent region, wherein: the light-transparent region allows light to pass therethrough; the light-shielding region blocks light; and the light modulation region partially allows light to pass therethrough and partially blocks light, so that the light modulation region has an average amount of light-transmitted per unit area smaller than that of the light-transparent region and larger than that of the light-shielding region.

2. The optical module of claim 1, wherein the light modulation region includes a plurality of light-transparent sub-regions and a plurality of light-shielding sub-regions, and the plurality of light-transparent sub-regions and the plurality of light-shielding sub-regions are alternatingly disposed.

3. The optical module of claim 1, wherein the light-shielding region partially surrounds the light-transparent region to form a boundary line, and two ends of the boundary line are substantially connected to middle sections of two opposite sides of the light modulation region.

4. The optical module of claim 1, wherein the average amount of light-transmitted per unit area of the light modulation region substantially maintains constant or is increased from the light-shielding region to the light-transparent region.

5. The optical module of claim 1, further comprising a light source having a light-emitting surface, wherein the light guide sheet guides light emitted from the light source; a vertical projection of the light source on the optical film falls within the light-shielding region; the light modulation region extends from the light-shielding region to the light-transparent region and is located between the light-transparent region and the light-emitting surface.

6. The optical module of claim 2, wherein each of the plurality of light-shielding sub-regions has a first end and a second end opposite to the first end; the first end is connected to the light-shielding region, and the second end extends to the light-transparent region.

7. The optical module of claim 2, wherein the light guide sheet has an edge; when the optical film, the light guide sheet, and the reflective film are stacked on one another, a vertical projection of the edge of the light guide sheet on the optical film partially falls within the light modulation region or within the light-shielding region adjacent to the light modulation region.

8. The optical module of claim 6, wherein the first end has a width larger than or equal to a width of the second end; when the width of the first end is larger than that of the second end, the width of the light-shielding sub-region is gradually reduced from the light-shielding region to the light-transparent region.

9. The optical module of claim 6, wherein the light modulation region surrounds the light-shielding region; a width of the first end is smaller than a width of the second end; the width of the light-shielding sub-region is gradually increased from the light-shielding region to the light-transparent region.

10. The optical module of claim 9, wherein the light guide sheet has a hole; when the optical film, the light guide sheet, and the reflective film are stacked on one another, a vertical projection of an edge of the hole of the light guide sheet on the optical film at least partially falls within the light modulation region; the plurality of light-shielding sub-regions and the plurality of light-transparent sub-regions are alternatingly disposed along the edge of the hole of the light guide sheet.

11. The optical module of claim 7, wherein the plurality of light-shielding sub-regions and the plurality of light-transparent sub-regions are alternatingly disposed along the edge of the light guide sheet.

12. A luminous keyboard, comprising: an optical module comprising: a light guide sheet; a reflective film on one side of the light guide sheet; and an optical film on another side of the light guide sheet opposite to the reflective film, the optical film having a mask pattern, the mask pattern defining a light-transparent region, a light-shielding region, and a light modulation region extending from the light-shielding region to the light-transparent region, wherein the light-transparent region allows light to pass therethrough; the light-shielding region blocks light; the light modulation region partially allows light to pass therethrough and partially blocks light, so that the light modulation region has an average amount of light-transmitted per unit area smaller than that of the light-transparent region and larger than that of the light-shielding region; and at least one keyswitch disposed over the optical module, the keyswitch including a keycap, wherein a vertical projection of the keycap on the optical film at least partially covers the light-transparent region.

13. The luminous keyboard of claim 12, wherein the light modulation region includes a plurality of light-transparent sub-regions and a plurality of light-shielding sub-regions, and the plurality of light-transparent sub-regions and the plurality of light-shielding sub-regions are alternatingly disposed.

14. The luminous keyboard of claim 12, wherein the light-shielding region partially surrounds the light-transparent region to form a boundary line, and two ends of the boundary line are substantially connected to middle sections of two opposite sides of the light modulation region.

15. The luminous keyboard of claim 12, wherein the optical module further comprises a light source; the light guide sheet guides light emitted from the light source; a vertical projection of the light source on the optical film falls within the light-shielding region; the light modulation region extends from the light-shielding region to the light-transparent region and is located between the light-transparent region and the light-emitting surface.

16. The luminous keyboard of claim 13, wherein each of the plurality of light-shielding sub-regions has a first end and a second end opposite to the first end; the first end is connected to the light-shielding region, and the second end extends to the light-transparent region.

17. The luminous keyboard of claim 13, wherein the light guide sheet has an edge; when the optical film, the light guide sheet, and the reflective film are stacked on one another, a vertical projection of the edge of the light guide sheet on the optical film partially falls within the light modulation region or within the light-shielding region adjacent to the light modulation region.

18. The luminous keyboard of claim 13, wherein the keycap has a light-transparent portion; the plurality of light-shielding sub-regions and the plurality of light-transparent sub-regions are alternatingly arranged along an extending direction of the light-transparent portion.

19. The luminous keyboard of claim 16, wherein the first end has a width larger than or equal to a width of the second end; when the width of the first end is larger than that of the second end, the width of the light-shielding region is gradually reduced from the light-shielding region to the light-transparent region.

20. The luminous keyboard of claim 13, wherein the light guide sheet has a hole; when the optical film, the light guide sheet, and the reflective film are stacked on one another, a vertical projection of an edge of the hole of the light guide sheet on the optical film at least partially falls within the light modulation region; the plurality of light-shielding sub-regions and the plurality of light-transparent sub-regions are alternatingly disposed along the edge of the hole of the light guide sheet.

* * * * *